(12) United States Patent
Chiu et al.

(10) Patent No.: US 7,768,854 B2
(45) Date of Patent: Aug. 3, 2010

(54) CONTROLLING APPARATUS AND CONTROLLING METHOD FOR CONTROLLING A PRE-CHARGE ACTIVITY ON A SRAM ARRAY

(75) Inventors: Ming-Cheng Chiu, Sinshih Township, Tainan County (TW); Meng-Wei Shen, Sinshih Township, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 324 days.

(21) Appl. No.: 12/112,441

(22) Filed: Apr. 30, 2008

(65) Prior Publication Data
US 2009/0273997 A1 Nov. 5, 2009

(51) Int. Cl.
*G11C 7/00* (2006.01)
(52) U.S. Cl. .................................... 365/203; 365/233.5
(58) Field of Classification Search ................. 365/203, 365/233.5, 154
See application file for complete search history.

(56) References Cited

U.S. PATENT DOCUMENTS

| | | | | |
|---|---|---|---|---|
| 4,972,373 A | * | 11/1990 | Kim et al. ................... | 365/203 |
| 5,432,747 A | * | 7/1995 | Fuller et al. ................. | 365/203 |
| 7,057,952 B1 | * | 6/2006 | Lee et al. .................... | 365/203 |
| 7,295,481 B2 | | 11/2007 | Pille et al. | |
| 7,679,948 B2 | * | 3/2010 | Park et al. ................... | 365/154 |

* cited by examiner

*Primary Examiner*—Anh Phung
(74) *Attorney, Agent, or Firm*—Thomas, Kayden, Horstemeyer & Risley

(57) ABSTRACT

A controlling apparatus and a controlling method for controlling a pre-charge activity on a SRAM array are provided. The controlling apparatus comprises: a detecting module, a controlling module and a pre-charge module. The detecting module is to detect whether the row address of the SRAM array in operation is changed and generate a row-changing signal according to the detection result; the controlling module is to detect an operation mode of the SRAM array and generate a disable signal according to the row-changing signal and the operation mode; and the pre-charge module is to generate a pre-charge signal according to a pseudo-pre-charge signal and the disable signal, wherein the pre-charge signal substantially controls the pre-charge activity on the SRAM cell in operation.

15 Claims, 4 Drawing Sheets

CONTROLLING APPARATUS AND CONTROLLING METHOD FOR CONTROLLING A PRE-CHARGE ACTIVITY ON A SRAM ARRAY

BACKGROUND

1. Field of Invention

The present invention relates to a controlling apparatus for controlling a pre-charge activity on a SRAM array. More particularly, the present invention relates to a controlling apparatus and a controlling method for controlling a pre-charge activity on a SRAM array.

2. Description of Related Art

In a driver IC adapted in a liquid crystal display panel of a portable device, a SRAM can be embedded to store the data on the display panel. If a frame on the display panel is still, the system only have to take the display data from the SRAM and doesn't need to refresh the data continuously to avoid power consumption.

Nevertheless, the portable device provides more and more multimedia data. The motion pictures showed on the display panel will result in continuous refreshment of the SRAM. Thus, the power consumption rises a lot due to the multimedia data.

Accordingly, what is needed is a controlling apparatus and a method for controlling a pre-charge activity on the SRAM array to avoid dummy power consumption and overcome the above issues. The present invention addresses such a need.

SUMMARY

A controlling apparatus for controlling a pre-charge activity on a SRAM array is provided. The controlling apparatus comprises: a detecting module, a controlling module and a pre-charge module. The detecting module is to detect whether the row address of the SRAM array in operation is changed and generate a row-changing signal according to the detection result; the controlling module is to detect an operation mode of the SRAM array and generate a disable signal according to the row-changing signal and the operation mode; and the pre-charge module is to generate a pre-charge signal according to a pseudo-pre-charge signal and the disable signal, wherein the pre-charge signal substantially controls the pre-charge activity on the SRAM cell in operation.

Another object of the present invention is to provide a controlling method for controlling a pre-charge activity on a SRAM array. The controlling method comprises the steps of: detecting an operation mode of the SRAM array; generating a row-changing signal when detecting that the row address of the SRAM array in operation is changed; generating a disable signal according to the row-changing signal and the operation mode; and generating a pre-charge signal according to a pseudo-pre-charge signal and the disable signal, wherein the pre-charge signal substantially controls the pre-charge activity on the SRAM cell in operation.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
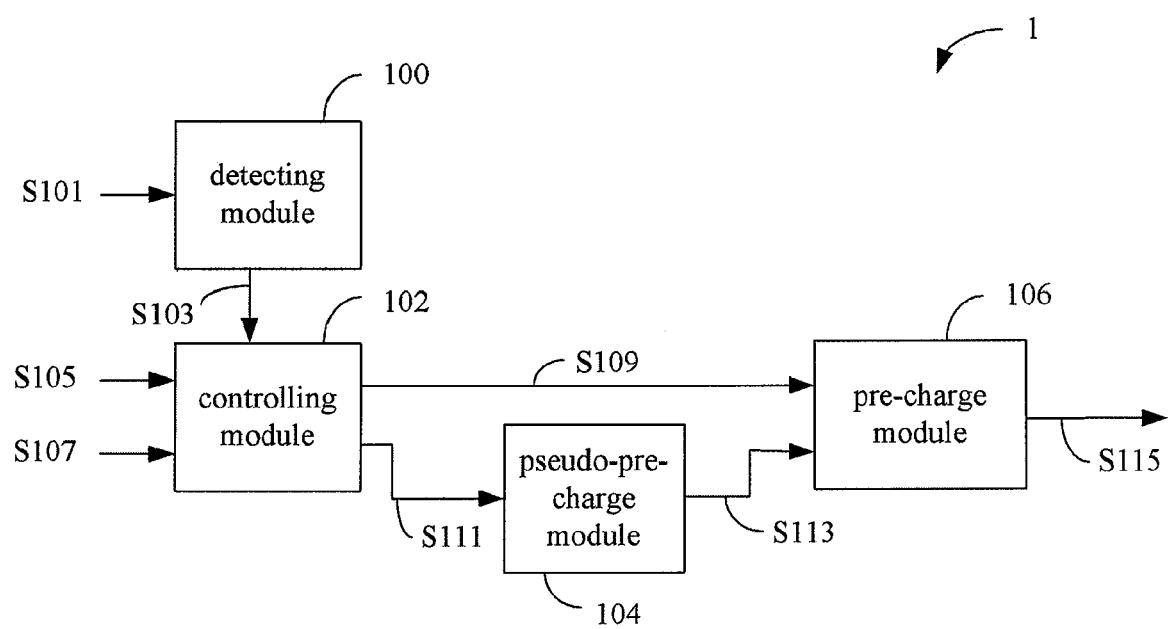
FIG. 1 is a block diagram of a controlling apparatus of the first embodiment of the present invention.

Reference will now be made in detail to the present embodiments of the invention, examples of which are illustrated in the accompanying drawings. Wherever possible, the same reference numbers are used in the drawings and the description to refer to the same or like parts.

Please refer to FIG. 1, a controlling apparatus 1 for controlling a pre-charge activity on a SRAM array (not shown) in the first embodiment of the present invention. The controlling apparatus 1 comprises: a detecting module 100, a controlling module 102, a pseudo-pre-charge module 104 and a pre-charge module 106. The detecting module 100 is to detect whether the row address 101 of the SRAM array in operation is changed and generate a row-changing signal S103 according to the detection result. The controlling module 102 is to receive a read request signal S105 and a write request signal S107 to detect an operation mode of the SRAM array and generate a disable signal S109 according to the row-changing signal S103 and the operation mode. The controlling module 102 further generates a clock S111 according to the operation mode. The pseudo-pre-charge module 104 generates a pseudo-pre-charge signal S113 according to a first state and a second state of the clock S111, wherein the first state and the second state are opposite. The pre-charge module 106 is to generate a pre-charge signal SS115 according to the pseudo-pre-charge signal S113 and the disable signal S109, wherein the pre-charge signal S115 substantially controls the pre-charge activity on the SRAM cell in operation. In the present embodiment, the pre-charge module 106 is an "OR" logic gate.

Figure 2:
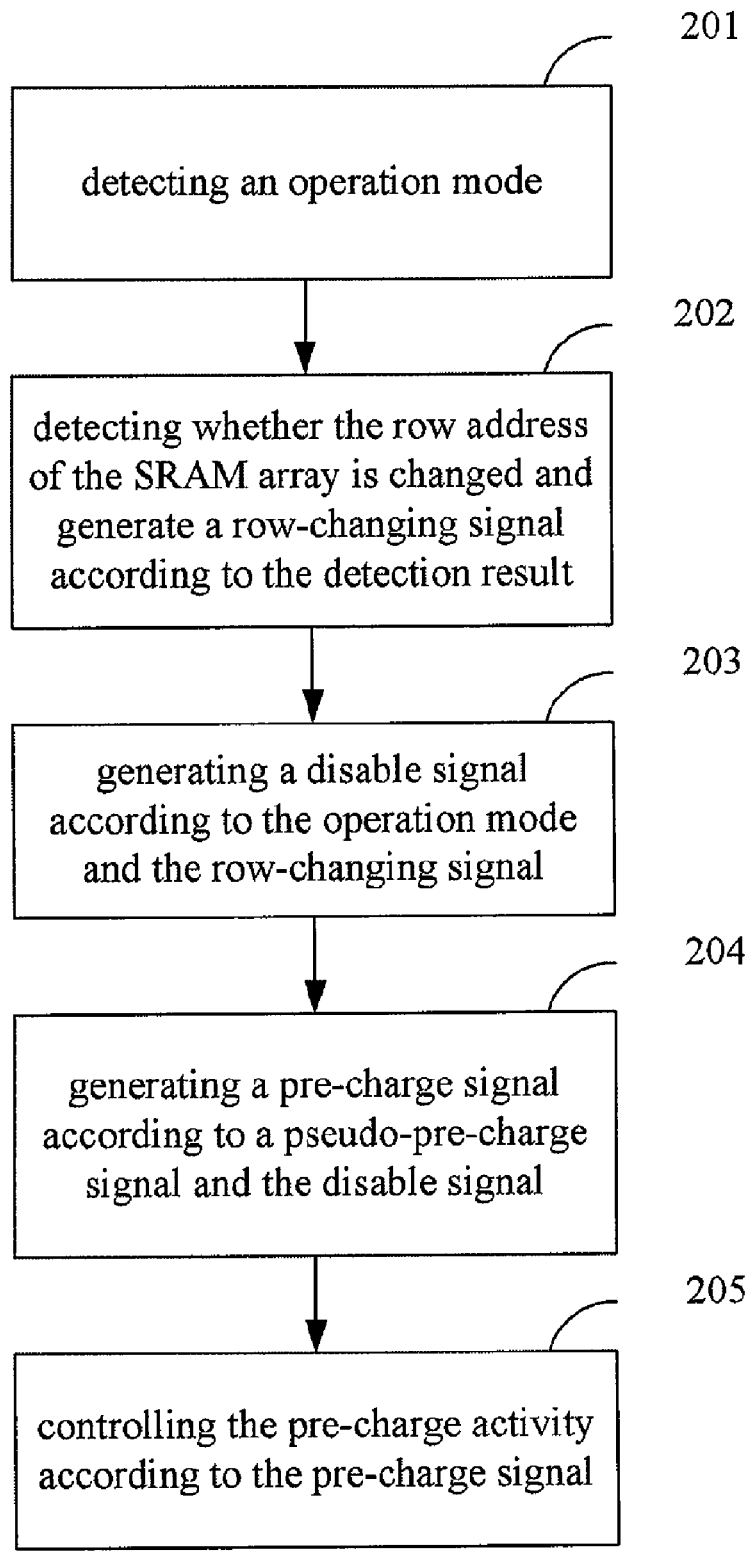
FIG. 2 is a flow chart of a controlling method of the second embodiment of the present invention.

Please refer to FIG. 2, the second embodiment of the present invention is a controlling method for controlling a pre-charge activity on a SRAM array. At first, in step 201, detecting an operation mode of the SRAM array; in step 202, generating a row-changing signal when detecting that the row address of the SRAM array in operation is changed; in step 203, generating a disable signal according to the row-changing signal and the operation mode; and in step 204, generating a pre-charge signal according to a pseudo-pre-charge signal and the disable signal, wherein in step 205, the pre-charge signal substantially controls the pre-charge activity on the SRAM cell in operation.

Figure 3:
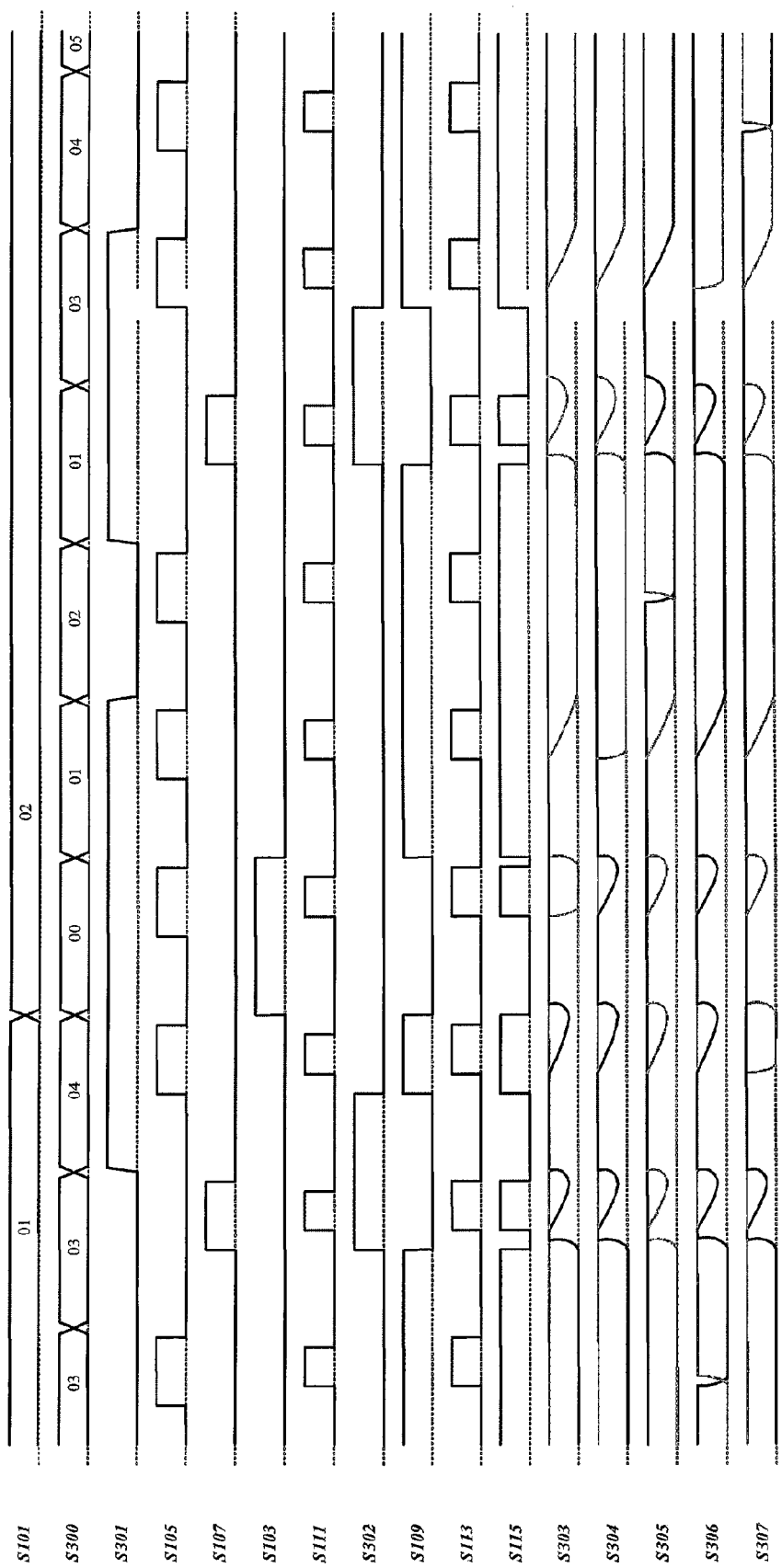
FIG. 3 is a timing diagram of various signals of the controlling apparatus of the present invention.

The main factors to affect the pre-charge signal are the clock, the operation mode and the row address of the SRAM cell in operation. Thus, when the clock is in a first state, which is a high state in the present embodiment, the pseudo-pre-charge signal makes the pre-charge signal disable the pre-charge activity on the SRAM cell in operation. When the clock is in a second state, which is a low state in the present embodiment, the operation mode is write and the row address of the SRAM cell in operation is not changed, the pseudo-pre-charge signal and the disable signal disable the pre-charge activity on the SRAM cell in operation. When the clock is in a second state, i.e. low state, the operation mode is write and the row address of the SRAM cell in operation is changed, the pseudo-pre-charge signal and the disable signal enable the pre-charge activity on the SRAM cell in operation. When the clock is in a second state, i.e. low state, and the operation mode is read, the pseudo-pre-charge signal and the disable signal enable the pre-charge activity on the SRAM cell in operation. As shown in FIG. 3, a timing diagram of the row address S101 of the SRAM, the column address S300 of the SRAM, the data signal S301, the write request signal S105, the read request signal S107, the row-changing signal S103, the clock S111, the operation mode S302, the disable signal S109, the pseudo-pre-charge signal S113, the pre-charge signal S115, and the pre-charge activity of five SRAM cells in different address S303-S307. It's noticed that: (1) The operation mode S302 specifies that a high state stands for a "read", and a low state stands for a "write"; (2) The disable signal S109 is related to the operation mode S302 and the row-changing signal S103; (3) The pseudo-pre-charge signal S113 is related to the clock S111; (4) The pre-charge signal S115 is a logic operation result of the disable signal S109 and the pseudo-pre-charge signal S113; (5) The pre-charge signal S115 enables the pre-charge activity when the pre-charge signal S115 is in low state; and (6) Each SRAM cell has a bit line and a bit line bar corresponding to the black and the gray line of the timing diagram of each of the five SRAM cells. The pre-charge activity is performed on both of the bit line and the bit line bar.

Figure 4:
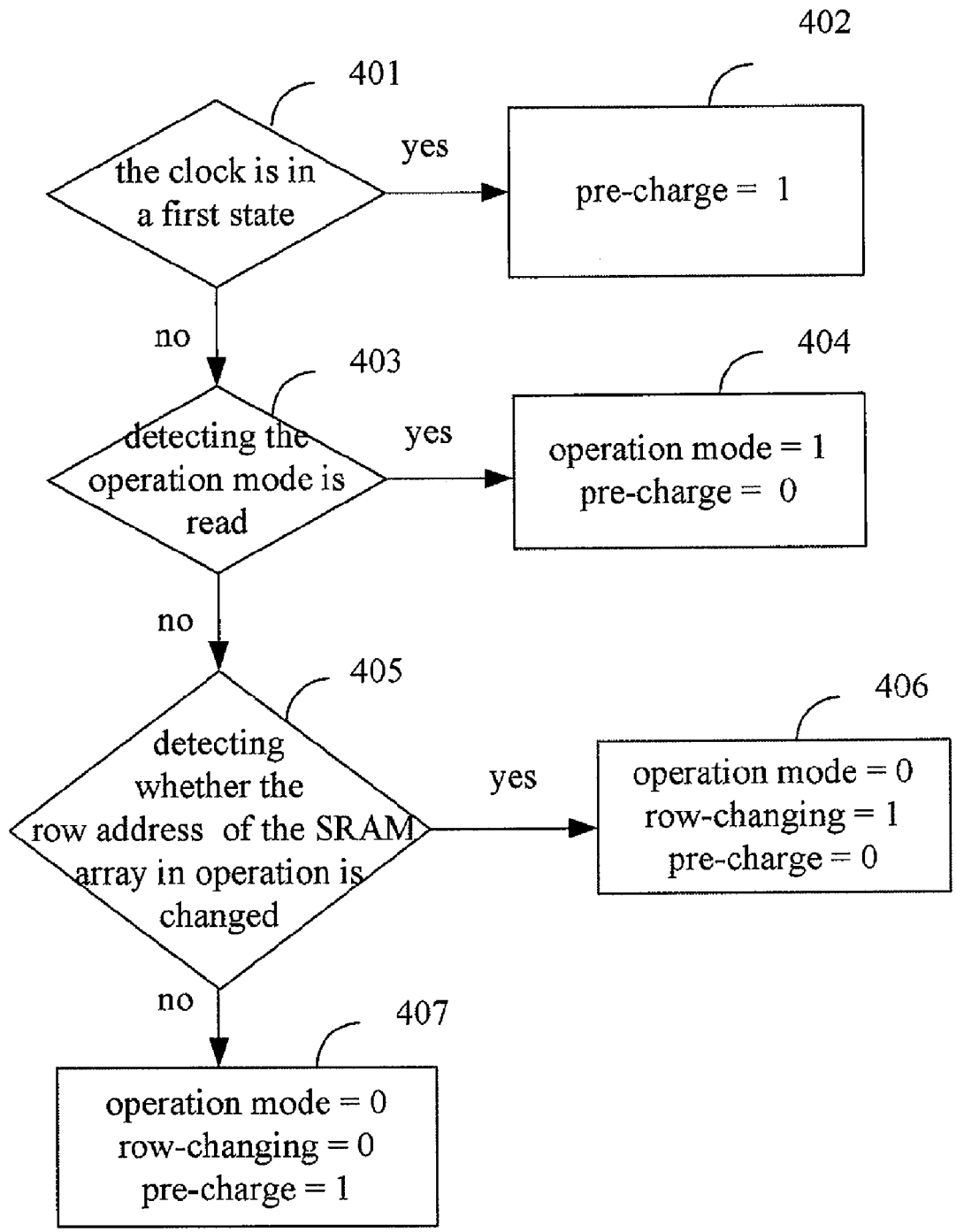
FIG. 4 is another flow chart of the controlling method of the present invention according to one embodiment of this invention.

According to the description above, the controlling method results in four different conditions as depicted as in FIG. 4. In step 401, determining whether the clock is in a first state. If the clock is in the first state, then the controlling method results in condition 402, the pre-charge is set to 1 to disable the pre-charge activity. If the clock is in the second state, the step 403 is executed to determine whether the operation mode is read. If the operation mode is read, then the controlling method results in condition 404, the operation mode is set to 1, and the pre-charge is set to 0 to enable the pre-charge activity. If the operation mode is write, the step 405 is executed to detect whether the row address of the SRAM array in operation is changed. If there is a difference, then the controlling method results in condition 406, the operation mode is set to 0, the row-changing signal is set to 1 and the pre-charge signal is set to 0 to enable the pre-charge activity. If there is no difference, then the controlling method results in condition 407, the operation mode is set to 0, the row-changing signal is set to 0 and the pre-charge signal is set to 1 to disable the pre-charge activity.

The controlling apparatus of the present invention detects (1) the operation mode (2) whether the row address of the SRAM array in operation is changed, and further controls the pre-charge activity on the SRAM array according to the detection result. The pre-charge activities only need to be performed on the SRAM array while necessary. Therefore, the dummy power consumption is avoided, and the overall power consumption is dramatically reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A controlling apparatus for controlling a pre-charge activity on a SRAM array, wherein the controlling apparatus comprises:
   a detecting module to detect whether the row address of the SRAM array in operation is changed and generating a row-changing signal according to the detection result;
   a controlling module to detect an operation mode of the SRAM array and generating a disable signal according to the row-changing signal and the operation mode; and
   a pre-charge module to generate a pre-charge signal according to a pseudo-pre-charge signal and the disable signal, wherein the pre-charge signal substantially controls the pre-charge activity on the SRAM cell in operation.

2. The controlling apparatus of claim 1, wherein the controlling module further generates a clock according to the operation mode.

3. The controlling apparatus of claim 2 further comprises a pseudo-pre-charge module to generate the pseudo-pre-charge signal according to a first state and a second state of the clock, wherein the first state and the second state are opposite.

4. The controlling apparatus of claim 3, when the clock is in a first state, the pseudo-pre-charge signal makes the pre-charge signal disable the pre-charge activity on the SRAM cell in operation.

5. The controlling apparatus of claim 3, when the clock is in a second state, the operation mode is write and the row address of the SRAM cell in operation is not changed, the pseudo-pre-charge signal and the disable signal disable the pre-charge activity on the SRAM cell in operation.

6. The controlling apparatus of claim 3, when the clock is in a second state, the operation mode is write and the row address of the SRAM cell in operation is changed, the pseudo-pre-charge signal and the disable signal enable the pre-charge activity on the SRAM cell in operation.

7. The controlling apparatus of claim 3, when the clock is in a second state and the operation mode is read, the pseudo-pre-charge signal and the disable signal enable the pre-charge activity on the SRAM cell in operation.

8. The controlling apparatus of claim 1, wherein the pre-charge module is a logic gate.

9. A controlling method for controlling a pre-charge activity on a SRAM array, wherein the controlling method comprises the steps of:
   detecting an operation mode of the SRAM array;
   generating a row-changing signal when detecting that the row address of the SRAM array in operation is changed;
   generating a disable signal according to the row-changing signal and the operation mode; and
   generating a pre-charge signal according to a pseudo-pre-charge signal and the disable signal, wherein the pre-charge signal substantially controls the pre-charge activity on the SRAM cell in operation.

10. The controlling method of claim 9, after the step of generating of the disable signal, further comprises the step of generating a clock according to the operation mode.

11. The controlling method of claim 10, after the step of generating the clock, further comprises the step of generating a pseudo-pre-charge signal a first state and a second state of the clock, wherein the first state and the second state are opposite.

12. The controlling method of claim 11, when the clock is in a first state, the pseudo-pre-charge signal makes the pre-charge signal disable the pre-charge activity on the SRAM cell in operation.

13. The controlling method of claim 11, when the clock is in a second state, the operation mode is write and the row address of the SRAM cell in operation is not changed, the pseudo-pre-charge signal and the disable signal disable the pre-charge activity on the SRAM cell in operation.

14. The controlling method of claim 11, when the clock is in a second state, the operation mode is write and the row address of the SRAM cell in operation is changed, the pseudo-pre-charge signal and the disable signal enable the pre-charge activity on the SRAM cell in operation.

15. The controlling method of claim 11, when the clock is in a second state and the operation mode is read, the pseudo-pre-charge signal and the disable signal enable the pre-charge activity on the SRAM cell in operation.

* * * * *